US009318802B2

(12) United States Patent
Smith et al.

(10) Patent No.: US 9,318,802 B2
(45) Date of Patent: Apr. 19, 2016

(54) FLEXIBLE SHOCK ABSORBING CONNECTIONS WITHIN A MOBILE COMPUTING DEVICE

(71) Applicant: Apple Inc., Cupertino, CA (US)

(72) Inventors: James B. Smith, Los Gatos, CA (US); Gregory N. Stephens, Sunnyvale, CA (US); Boon W. Shiu, San Jose, CA (US); Shayan Malek, San Jose, CA (US); Marwan Rammah, Cupertino, CA (US); Scott A. Myers, Saratoga, CA (US); Ashutosh Y. Shukla, Santa Clara, CA (US); Eric N. Nyland, Santa Clara, CA (US); Matthew D. Hill, Santa Clara, CA (US); Michael Benjamin Wittenberg, Sunnyvale, CA (US); Rasamy Phouthavong, Campbell, CA (US); Benjamin Shane Bustle, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/567,850

(22) Filed: Dec. 11, 2014

(65) Prior Publication Data

US 2016/0064810 A1 Mar. 3, 2016

Related U.S. Application Data

(63) Continuation of application No. PCT/US2014/069693, filed on Dec. 11, 2014.

(60) Provisional application No. 62/051,763, filed on Sep. 17, 2014, provisional application No. 62/042,692, filed on Aug. 27, 2014.

(51) Int. Cl.

| | |
|---|---|
| ***H05K 1/00*** | (2006.01) |
| ***H01Q 1/50*** | (2006.01) |
| ***H01Q 1/24*** | (2006.01) |
| ***H01R 4/48*** | (2006.01) |

(52) U.S. Cl.
CPC ................ *H01Q 1/50* (2013.01); *H01Q 1/243* (2013.01); *H01R 4/48* (2013.01)

(58) Field of Classification Search
USPC .................... 361/749, 751, 752; 343/700 MS
See application file for complete search history.

(56) References Cited

U.S. PATENT DOCUMENTS

| | | | | |
|---|---|---|---|---|
| 2006/0066772 | A1 | 3/2006 | Takahashi et al. | |
| 2011/0157844 | A1* | 6/2011 | Chan ................ | G02F 1/133308 361/749 |
| 2012/0121117 | A1* | 5/2012 | Kim ....................... | H04M 1/03 381/334 |
| 2013/0334945 | A1* | 12/2013 | Lee ......................... | H05K 5/02 312/312 |
| 2014/0140018 | A1* | 5/2014 | Malek ................ | H04M 1/0277 361/749 |

OTHER PUBLICATIONS

International Search Report & Written for PCT/US2014/069693 dated May 19, 2015, 2014.

* cited by examiner

*Primary Examiner* — Hoang V Nguyen
*Assistant Examiner* — Hai Tran
(74) *Attorney, Agent, or Firm* — Downey Brand LLP

(57) ABSTRACT

The subject matter of the disclosure relates to connectors for antenna feed assemblies and display coupling components of a mobile device. The flexible connectors can be configured with a flexible spring connector component that couples a mobile device antenna to a main logic board of the mobile device within a housing of the mobile device such that the flexible connector can withstand a drop event, while at the same providing for an in-line inductance as part of an antenna-defined design requirement. The display of the mobile device can be coupled to a housing of the mobile device using a pin-screw arrangement that allows the display to controllably shift in the X-direction and the Y-direction, while only being purposefully constrained in the Z-direction (with reference to a 3-dimensional graph having X, Y, and Z axes). This configuration can prevent the display from being pulled out of alignment during a drop event.

20 Claims, 11 Drawing Sheets

FLEXIBLE SHOCK ABSORBING CONNECTIONS WITHIN A MOBILE COMPUTING DEVICE

CROSS-REFERENCE TO RELATED APPLICATION(S)

This is a continuation of International PCT Application No. PCT/US14/69693 filed Dec. 11, 2014, and claims priority to U.S. Provisional Application No. 62/051,763, filed Sep. 17, 2014 entitled "FLEXIBLE SHOCK ABSORBING CONNECTIONS WITHIN A MOBILE COMPUTING DEVICE", and also claims priority to U.S. Provisional Application No. 62/042,692, filed Aug. 27, 2014 entitled "FLEXIBLE SHOCK ABSORBING CONNECTIONS WITHIN A MOBILE COMPUTING DEVICE" each of which is incorporated by reference herein in its entirety for all purposes

FIELD

The described embodiments generally relate to computing device structural components, and more particularly, to connectors for antenna assemblies or display components of a mobile device.

BACKGROUND

Mobile computing devices are becoming increasingly popular in modern society. Most adults and teenagers in the United States (and abroad) now own at least one cellular phone device, and optionally various alternative or supplemental portable computing devices such as a tablet computer, a music player device, a mixed-media playback device, a watch device, a mobile hotspot device, a health monitoring device, etc. With the advent of this increasing popularity, mobile device manufacturers are now fabricating and assembling millions of duplicate computing devices to accommodate an exponentially increasing demand for devices that showcase new hardware features and other advertised technological advancements.

As mobile device manufacturers produce millions of devices in tandem, many of these devices will be subject to the rigors of daily use by consumers. Therefore, it is important for these manufactures to design and fabricate durable hardware and electronic components that can withstand impact events. For example, during a drop event, a mobile device can potentially become deformed or destroyed by various hardware components (e.g., external or internal hardware components) shifting, fracturing, tearing, or shattering, in response to an impact force that is exerted at an external surface of the device when the device hits a rigid surface (e.g., concrete, asphalt, wood, tile, brick, ceramic, linoleum, etc.).

At present, the primary focus of impact-resistant hardware design for mobile devices is directed to the external surface hardware of a device, without consideration of the vast majority of the physical structures and components of the device, which reside within the housing or combined housings of a portable electronic device. In this regard, much focus has been placed on display glass and shell durability in vacuum, and therefore, impact events routinely damage internal hardware of a mobile device without substantially affecting the appearance and external functionality of the device.

SUMMARY

This summary is provided to introduce a selection of concepts that are further described below in the Detailed Description. This summary is not intended to identify key features of the claimed subject matter, nor is it intended to be used as an aid in determining the scope of the claimed subject matter.

Various embodiments disclosed herein provide for durable shock-absorbing connectors for antenna feed assemblies and display coupling components of a mobile device. In one configuration a mobile device may be configured with any number of antenna feed structures that can couple an antenna of the mobile device to a main logic board (MLB) of the mobile device. For example, an antenna feed structure of the mobile device may include a first connector for coupling the antenna feed structure to the MLB, a second connector for coupling the antenna feed structure to an antenna of the mobile device, and a flex with an inductor coupled thereto, which is coupled to both the first connector and the second connector of the antenna feed structure, to provide an in-line inductance for the antenna of the mobile device.

In one specific embodiment, the antenna feed structure can be formed from a number of components including a first spring clip connector secured to a first electrical component by a first fastener. A first end of a flexible circuit can be attached to the first spring clip connector and a second end of the flexible circuit can be attached to a second electrical component by a second fastener. A stiffener can overlay a substantial portion of the flexible circuit in order to provide rigidity to a portion of the flexible circuit. During a drop event, the first electrical component and the second electrical component can change positions relative to each other. The first spring clip connector can accommodate the relative changes in position.

A mobile device is disclosed. The mobile device can include an antenna element and a printed circuit board (PCB). The antenna element and the PCB can be coupled to each other by a flexible connector. The flexible connector can include a spring clip connector coupled to the antenna element. A flexible circuit can attach to the spring clip connector at a first end of the flexible circuit and the PCB at a second end of the flexible circuit. A stiffener can resist movement of the flexible circuit during changes in position of the antenna element with respect to the PCB so that substantially all force imparted to the flexible connector by the changes in position is accommodated by the spring clip connector.

Another mobile device is disclosed. The mobile device can include an antenna element that supports a radio frequency (RF) function. The antenna element can couple to a printed circuit board (PCB) through an inductive flexible connector. The inductive flexible connector can include a spring clip connector secured to the antenna element. The inductive flexible connector can also include a flexible circuit coupled to the spring clip connector. The flexible circuit can include a trace arranged in a pattern that provides an in-line inductance between the antenna element and the PCB. The pattern is arranged to provide an amount of inductance that optimizes the RF function of the antenna element. The inductive flexible connector can also include a stiffener that constrains movement of the flexible circuit. During a drop event, the spring clip connector can deform to accommodate relative movement of the antenna element with respect to the PCB.

In accordance with some embodiments, the inductor may be configured with inductive characteristics that are designated for impedance matching one or more hardware components of the mobile device with the antenna to improve reception of a radio frequency signal at the antenna. Further, during a drop event the flex, in combination with a spring connector of the antenna feed structure, is configured to allow the antenna feed structure to withstand the impact of the drop event without deformation or loss of function.

In other embodiments, a resilient mobile device may be configured with a display portion having multiple flanges, a lower housing portion having multiple screw hole vias, and multiple pin-screw connectors respectively having a lower pin portion and an upper screw portion. In some configurations, the display portion of the mobile device may be coupled to the lower housing portion of the mobile device when the upper screw portions of the pin-screw connectors are coupled to the screw hole vias of the lower housing portion, at the same time the lower pin portions of the pin-screw connectors are coupled to the flanges of the display portion.

In some implementations, each of the flanges of the display portion can be configured with a receptacle, such that the lower pin portions of the pin-screw connectors slidably couple within the receptacles of the flanges. Further, each of the screw hole vias of the lower housing portion may be threaded to couple to an upper screw portion of the pin-screw connector, such that the upper screw portions of the pin-screw connectors are fixedly coupled to the plurality of screw hole vias of the lower housing portion.

In other aspects, the slidable couplings of the lower pin portions of the pin-screw connectors within the receptacles of the flanges allow the display portion to shift a predetermined distance in the X-direction and a predetermined distance in the Y-direction, while being securely engaged with the lower housing portion in the Z-direction (with reference to a 3-dimensional graph having X, Y, and Z axes).

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
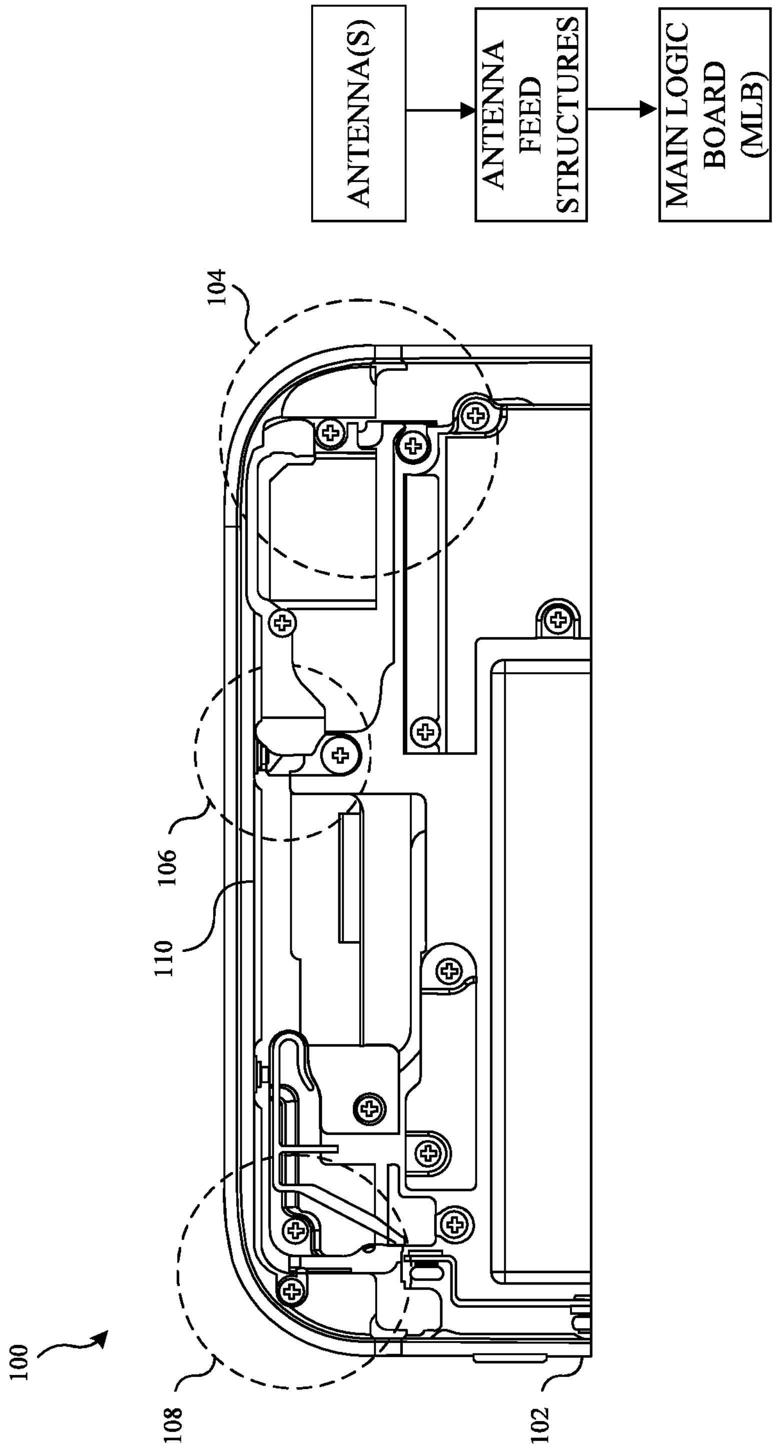
FIG. 1 illustrates a hardware-level diagram of a mobile device showing multiple antenna feed structures, in accordance with some embodiments of the disclosure.

Representative examples of flexible shock-absorbing connectors for a mobile device are described within this section. Additionally, various examples of shock-absorbing connectors for a mobile device, durable antenna feed connectors, and display housing connectors are also described herein. These examples are provided to add context to, and to aid in the understanding of, the cumulative subject matter of this disclosure. It should be apparent to one having ordinary skill in the art that the present disclosure may be practiced with or without some of the specific details described herein. Further, various modifications or alterations can be made to the subject matter described herein, and illustrated in the corresponding figures, to achieve similar advantages and results, without departing from the spirit and scope of the disclosure.

References are made in this section to the accompanying figures, which form a part of the disclosure and in which are shown, by way of illustration, various implementations corresponding to the described embodiments herein. Although the embodiments and scenarios of this disclosure are described in sufficient detail to enable one having ordinary skill in the art to practice the described implementations, it should be understood that these examples are not to be construed as being overly-limiting or all-inclusive.

In some embodiments, the shock-absorbing connectors can include, flexible connectors, feed elements, short elements, ground elements, or any other antenna related element, that can provide a conductive bridge between an antenna and another circuit of a mobile device. Examples of other antenna elements can include a grounding circuit in direct contact with chassis ground, or in some embodiments, a main logic board (MLB), which also may include electrically conductive pathways leading to chassis ground. It should be noted that various embodiments will be discussed in which the shock-absorbing connectors are referred to as flexible connectors; however, this is for exemplary purposes only and should not be construed as limiting. Each of the flexible connectors is configured with one or more of a spring connector, a flexible circuit, an in-line inductor, a rigid connector, and a clip connector, etc., in a physical arrangement that allows the flexible connector to withstand a drop event. Additionally, the design of the flexible connectors balance the ability to withstand drop events with a risk of electrically shorting the connector. For example, some embodiments include one or more bend regions. During drop events, the bend regions in the flexible connector can quickly absorb large amounts of stress by flexing to accommodate relative movement between internal components during drop events. Geometry of the flexible connectors and specifically the bend regions defined by the flexible connectors, should be designed to reduce a likelihood of internal or external short circuits during the flexing. It should be noted that in the case of a flexible connector that includes an in-line inductor, the flexing of the flexible connector could cause inductance to vary. In such a configuration, flexing of the portion of the flexible connector that includes the in-line inductor can be minimized with stiffening elements. In other embodiments, the flexible connectors of a display housing assembly can provide a mechanism for securely engaging a display to a housing of a mobile device in such a manner that the display is purposely constrained in only one direction, such as the Z-direction (with reference to a 3-dimensional graph having X, Y, and Z axes). During a drop event, the display can optionally shift a designated distance in the X-direction and/or the Y-direction, while remaining engaged with the housing and in a fixed position with respect to the Z-direction.

In accordance with various embodiments, FIG. 1 depicts hardware-level diagram 100 of mobile device 102 that includes flexible connectors 104, 106, and 108 (described further herein with respect to FIGS. 2-5). Mobile device 102 may be representative of a cellular phone or smart phone, a tablet computer, a laptop or netbook computer, a media playback device, an electronic book device, a watch device, a mobile hotspot device, a health monitoring device, etc., without departing from the spirit and scope of the disclosure. Flexible connectors 104, 106, and 108 can electrically and mechanically couple a printed circuit board (PCB) to antenna element 110. It should be understood that, in various implementations, each of flexible connectors 104, 106, and 108, may be configured to connect (directly or indirectly) to a single antenna, or alternatively, to multiple antennas (not shown), that reside(s) within the housing of mobile device 102.

Further, in accordance with some embodiments, it should be understood that each of flexible connectors, 104, 106, and 108, may be configured to connect (directly or indirectly) to one or more other hardware component(s) within the housing of mobile device 102, such as a main logic board (MLB) or another printed circuit board (PCB) component. In various configurations, antenna element 110 may support an antenna configured to receive radio frequency (RF) signals associated with various cellular telecommunication technologies (e.g., 4G, 3G, or 2G cellular access technologies), Wi-Fi™ (IEEE 802.11 standard) or WiMAX™ (IEEE 802.16 standard) technologies, Bluetooth™ technologies, etc., at an RF frontend of mobile device 102. Further, any of flexible connectors 104, 106, and 108, may be configured to pass received RF signals from an antenna such as antenna element 110 to one or more hardware components of mobile device 102, such as the MLB.

Figure 2A:
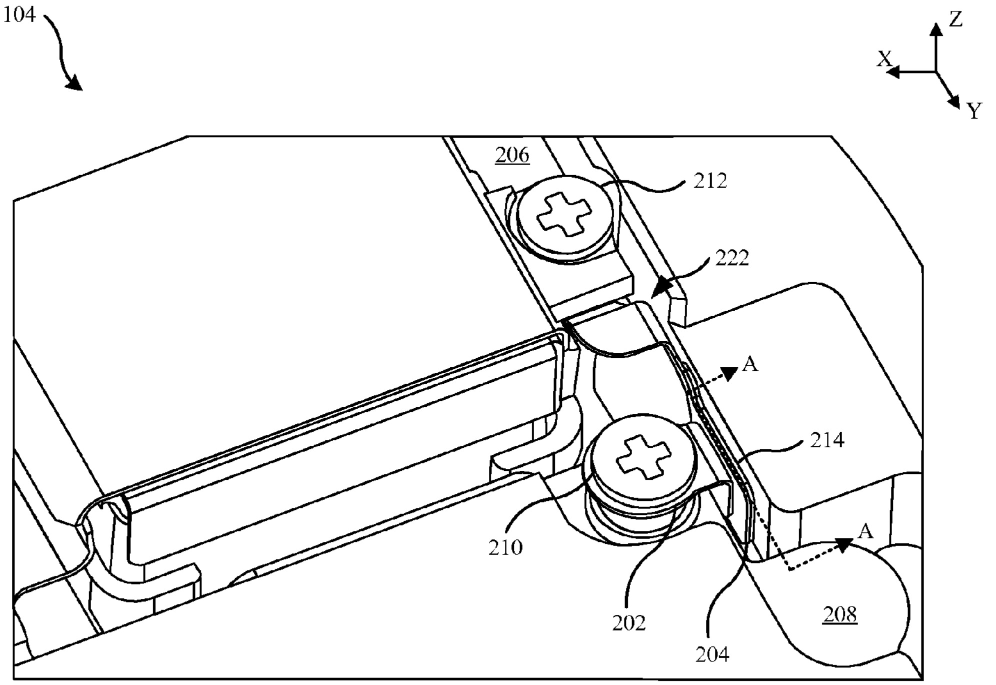
FIGS. 2A-2B depict a hardware-level diagram showing an antenna feed structure that includes a flexible circuit component, in accordance with various embodiments of the disclosure.

FIG. 2A depicts a hardware-level diagram showing flexible connector 104 that includes one or more flexible components of mobile device 102 of FIG. 1. In some configurations, flexible connector 104 can be fabricated and assembled in a manner that substantially prevents deformation that may traditionally be caused by a drop event, or some other impact event. In this regard, flexible connector 104 may be composed of spring clip connector 202 that can be coupled (e.g., soldered) at a designated angle with flexible circuit 204, which can include a copper trace layer for conductively passing RF signals from antenna element 206 to PCB 208. In some embodiments, spring clip connector 202 can be a metal (e.g., a stainless steel, copper, or aluminum, etc.) or a non-metal conductive, mechanical spring structure that flexibly couples flexible circuit 204 to a mounting point of PCB 208. In some embodiments, fastener 210 can couple spring clip connector 202 with PCB 208 through an opening defined by spring clip connector 202. In some embodiments, PCB 208 can be a main logic board (MLB). Additionally, flexible circuit 204 can be coupled to antenna element 206 by fastener 212 passing through an opening defined by flexible circuit 204. Alternatively, fastener 212 can be coupled to flexible circuit 204 by way of a second spring clip connector (not shown). It should be understood that spring clip connector 202 and flexible circuit 204 may be coupled to PCB 208 or antenna element 206 using any other common coupling implement, without departing from the spirit and scope of the disclosure. Flexible circuit 204 can also be reinforced by stiffener 214, which prevents flexible circuit 204 from bending under stresses imparted during a drop event. In some embodiments, stiffener 214 can be laminated to a surface of flexible circuit 204. In some embodiments, stiffener 214 can be formed from a number of discrete stiffeners or a number of layers of stiffening material. Stiffener 214 can be operative to provide any number of functions for flexible connector 104 including one or more of the following functions: supporting flexible circuit 204, preventing wear on flexible circuit 204, and electrically isolating flexible circuit 204 from other components of mobile device 102. Structural support provided to flexible circuit 204 by stiffener 214 can also help to prevent a change in electrical properties of any circuitry disposed upon flexible circuit 204 by preventing bending of flexible circuit 204 during an impact event.

Figure 2B:
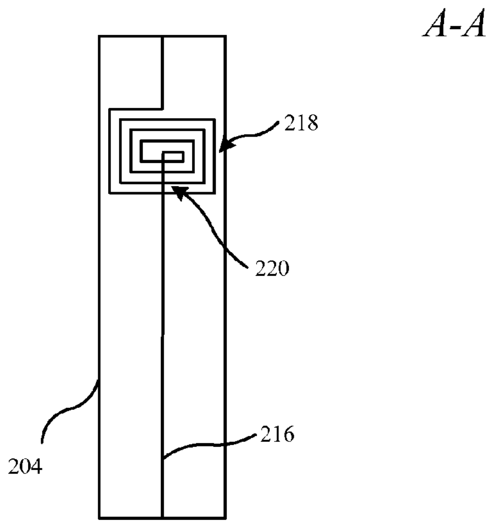

FIG. 2B depicts a section view of flexible circuit 204 in accordance with section line A-A. FIG. 2B also shows how an embedded trace 216 including inductive element 218 can be arranged on flexible circuit 204. Inductive element 218 can provide an in-line inductance for signals transmitted through embedded trace 216. The magnitude of the in-line inductance can be selected in order to optimize the RF signal function for impedance matching purposes. In some embodiments, inductance can be provided by a geometry of inductive element 218. For example, inductive element 218 can be arranged in a spiral geometry. In some embodiments, inductive element 218 can be a discrete surface mounted inductor component mounted to embedded trace 216. Embedded trace 216 can be relatively straight or have a geometry that does not create a substantial inductance. In other embodiments, inductive element 218 can include both a printed inductance pattern, as depicted and a discrete surface mounted inductor component. It should be noted that embedded trace 216 can span two or more layers of flexible circuit 204 so that portion 220 of trace 216 from intersecting inductive element 218. For example, FIG. 2B appears to depict inductive element 218 intersecting portion 220; however, when portion 220 is positioned within a different layer of flexible circuit 204 than inductive element 218 no intersection occurs.

In some configurations, flexible circuit 204 may have one or more bends 222 in the X, Y, and Z directions (with reference to a 3-dimensional graph having X, Y, and Z axes), which in combination with spring clip connector 202, allow flexible circuit 204 to bend and flexibly deform during a drop event without mobile device 102 sustaining any permanent damage at flexible connector 104. This functionality can be considered to be a self-healing mechanism for the internal hardware components of flexible connector 104.

Figure 3:
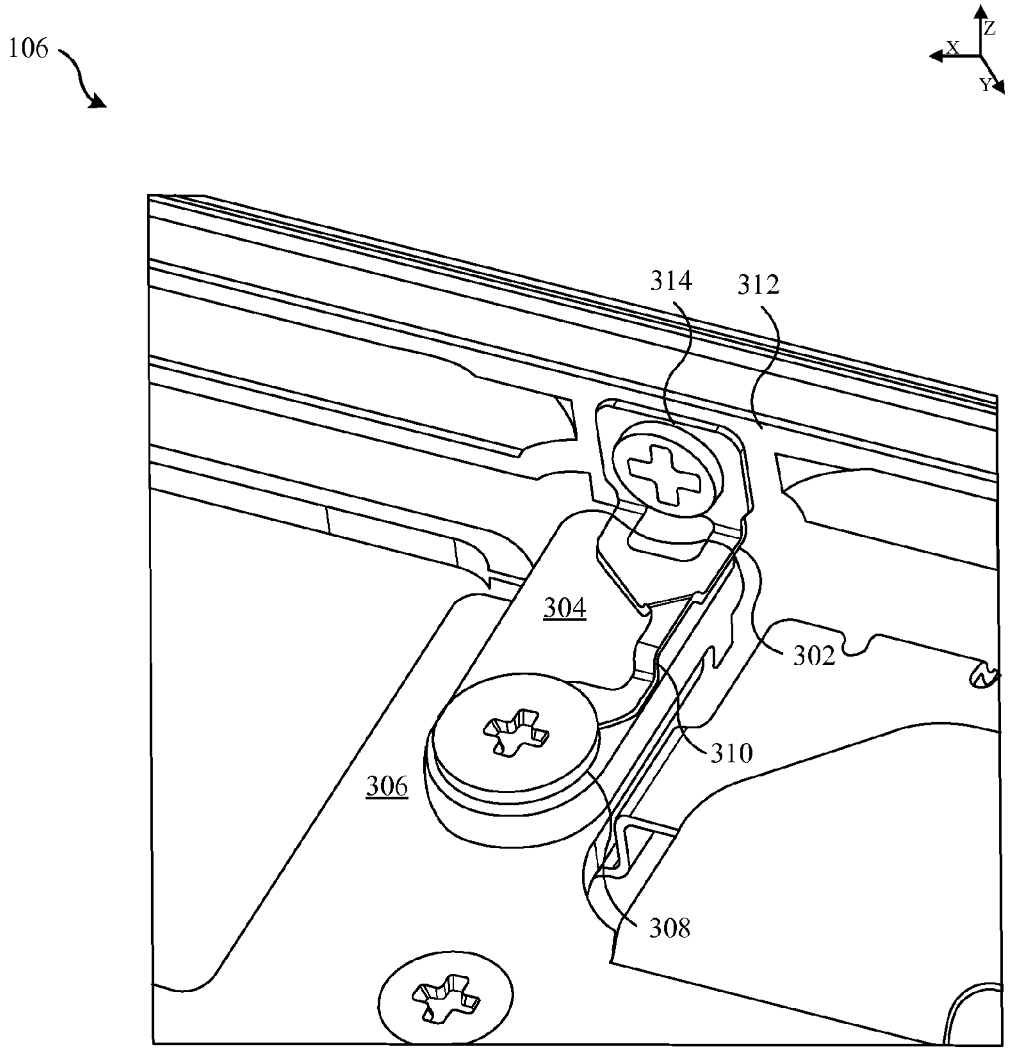
FIG. 3 illustrates a hardware-level diagram showing an antenna feed structure that includes a shielded spring clip connector component, in accordance with some embodiments of the disclosure.

FIG. 3 illustrates a hardware-level diagram showing flexible connector 106 that includes spring clip connector 302, in accordance with some embodiments of the disclosure. In some configurations, flexible connector 106 can be manufactured in such a manner to substantially prevent deformation that may occur at mobile device 102 in response a drop event, or some other impact event. In this regard, flexible connector 106 may include spring clip connector 302 that can conductively pass RF signals from an antenna to the MLB. In various configurations, spring clip connector 302 can be covered with shield 304. Shield 304 can include a flexible plastic coating or a silicon sheath that electrically isolates (insulates) spring clip connector 302 from underlying circuitry that may otherwise cause an electrical short with spring clip connector 302.

In some embodiments, spring clip connector 302 can be a metal (e.g., a stainless steel, copper, or aluminum, etc.) or a non-metal conductive, mechanical spring structure that flexibly couples with printed circuit board 306 by way of fastener 308. In some embodiments, printed circuit board 306 can be a main logic board (MLB). Spring clip connector 302 may include service loop 310 corresponding to a flexible bend/structure of a predefined length that affords spring clip connector 302 some level of compliance in one or more of the X, Y, and Z directions (with reference to a 3-dimensional graph having X, Y, and Z axes). Spring clip connector 302 may also be coupled to antenna element 312 of mobile device 102, via fastener 314. Fastener 314 can pass through an opening disposed on spring clip connector 302. However, it should be understood that spring clip connector 302 may be connected at either end to a rigid hardware component or housing of mobile device 102 using any other common coupling implement, without departing from the spirit and scope of the disclosure.

In some configurations, spring clip connector 302 of flexible connector 106 may be fabricated with one or more bends in the X, Y, and/or Z directions, which enable spring clip connector 302 to bend and flexibly deform during a drop event, without mobile device 102 sustaining any permanent damage due to damaged function of flexible connector 106. This can be considered to be a self-healing mechanism for the internal hardware components of flexible connector 106. In some embodiments, spring clip connector 302 may be fabricated, per design, to have a particular length that is antenna-defined (e.g., for RF impedance matching), as would be understood by those in the field of antenna design. Further, spring clip connector 302 of flexible connector 106 may also be fabricated of a predetermined, antenna-defined thickness, and of a predetermined material (e.g., stainless steel, copper, or aluminum) to prevent corrosion and provide for a higher yield strength.

Figure 4:
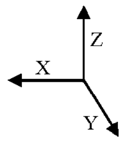
FIG. 4 depicts a hardware-level diagram showing a first view of an antenna feed structure that includes an accordion spring clip connector component, in accordance with various embodiments of the disclosure.
Figure 4:
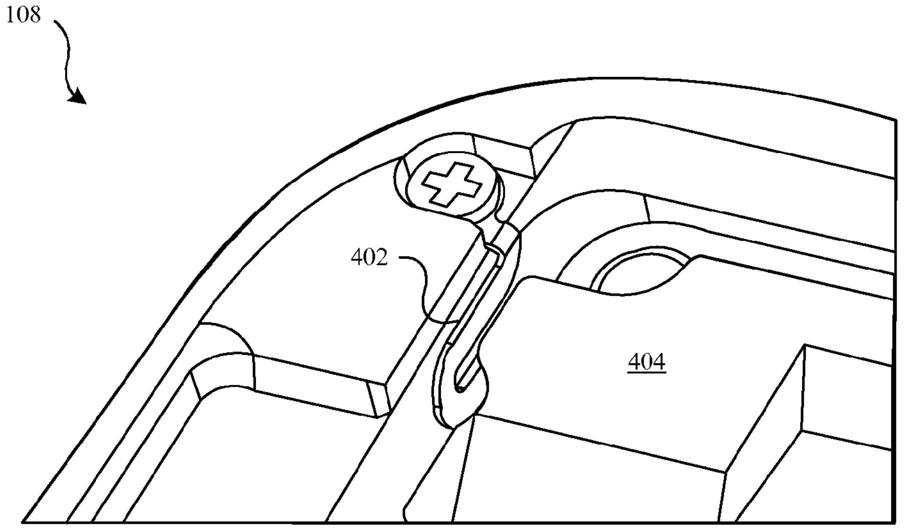

FIG. 4 depicts a hardware-level diagram showing a view of flexible connector 108 that includes accordion spring clip connector 402 of mobile device 102 of FIG. 1, in accordance with various embodiments of the disclosure. Accordion spring clip connector 402 can be shaped to avoid an obstacle such as shield 404. In this regard, flexible connector 108 may be composed of accordion spring clip connector 402 that can conductively pass RF signals from a first component to a second component. In some configurations, accordion spring clip connector 402 may or may not be covered within a flexible insulated coating to electrically isolate accordion spring clip connector 402 from underlying circuitry.

Figure 5:
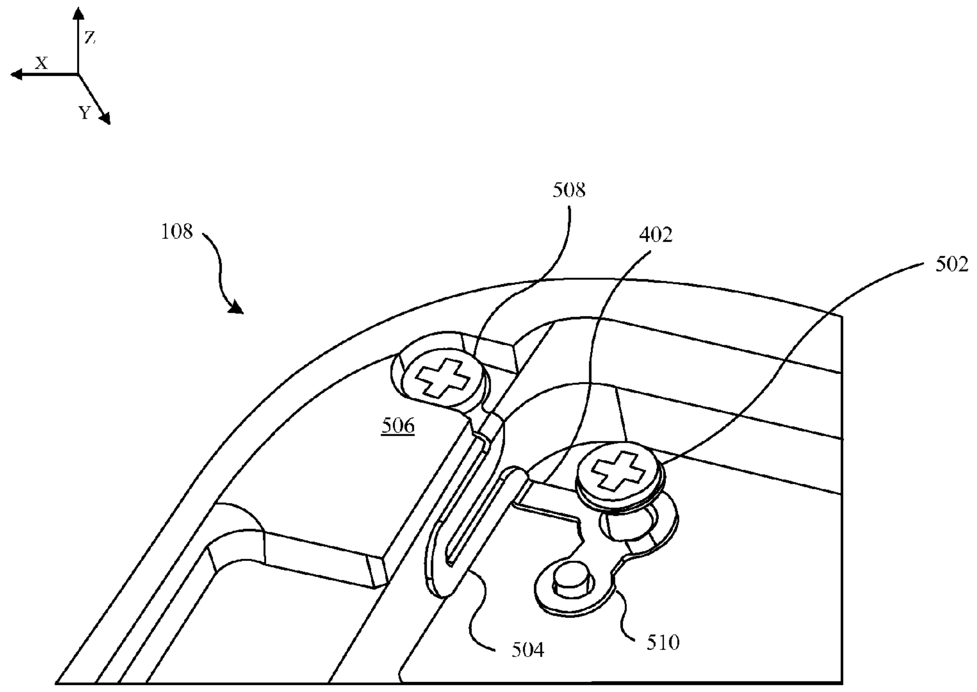
FIG. 5 illustrates a hardware-level diagram showing another view of the antenna feed structure that includes an accordion spring clip connector component of FIG. 4, in accordance with some embodiments of the disclosure.

FIG. 5 illustrates another, more revealing, hardware-level diagram showing how flexible connector 108 also includes accordion spring clip connector 402. In various embodiments, accordion spring clip connector 402 of flexible connector 108 can be a metal (e.g., a stainless steel, copper, or aluminum, etc.) or a non-metal conductive. Accordion spring clip connector 402 can provide a mechanical spring structure that flexibly couples accordion spring clip connector 402 to a standoff mount of the housing of mobile device 102 with fastener 502. In some embodiments, fastener 502 can be a screw connector. Accordion spring clip connector 402 may include service loop 504 corresponding to a flexible bend/structure of a predefined length that affords accordion spring clip connector 402 some level of compliance in one or more of the X, Y, and Z directions (with reference to a 3-dimensional graph having X, Y, and Z axes). Further, accordion spring clip connector 402 may be coupled to antenna element 506 of mobile device 102, using fastener 508. In some embodiments, accordion spring clip connector 402 can include a rotational stabilizing member 510 that extends away from fastener 502 and engages an element protruding from the housing of mobile device 102. In this way, rotation of accordion spring clip connector 402 about fastener 508 can be prevented. In some embodiments, accordion spring clip connector 402 of flexible connector 108 may be connected at either end to a rigid hardware component or housing of mobile device 102 using any other common coupling implement, without departing from the spirit and scope of the disclosure.

In some embodiments, accordion spring clip connector 402 of flexible connector 108 may be fabricated with one or more bends in the X, Y, and/or Z directions, which enable accordion spring clip connector 402 to bend and flexibly deform during a drop event, without mobile device 102 incurring any damage at flexible connector 108. This may be considered to be a self-healing mechanism for the internal hardware components of flexible connector 108. In some embodiments, accordion spring clip connector 402 may be manufactured to have a particular length that is antenna-defined (e.g., for RF impedance matching). Further, accordion spring clip connector 402 may also be fabricated of a predetermined, antenna-defined thickness, and of a predetermined material (e.g., stainless steel, copper, or aluminum) to prevent corrosion and provide for a higher yield strength.

As depicted in the hardware-level diagram 100 of FIG. 1, often several antenna connections, e.g., flexible connectors, 104, 106, and 108 (described further herein with respect to FIGS. 2-5), can be made between an MLB and antenna element 110 of mobile device 102. Some of these connections can have significant geometrical constraints within the housing(s) of mobile device 102, which limit opportunities to incorporate sufficient service loops/compliance to adequately mechanically isolate the connections (e.g., one of flexible connectors 104, 106, and 108) from the effects of relative movement between a PCB and antenna element 110 (e.g., during an impact event). As described above, with respect to FIG. 1, this scenario can be particularly problematic when circuit components, such as inductors (e.g., embedded or add-on inductors), must be configured in-line with the connection (e.g., flexible connector 104) due to the rigidity of the MLB connections and the other circuit components.

Figure 6:
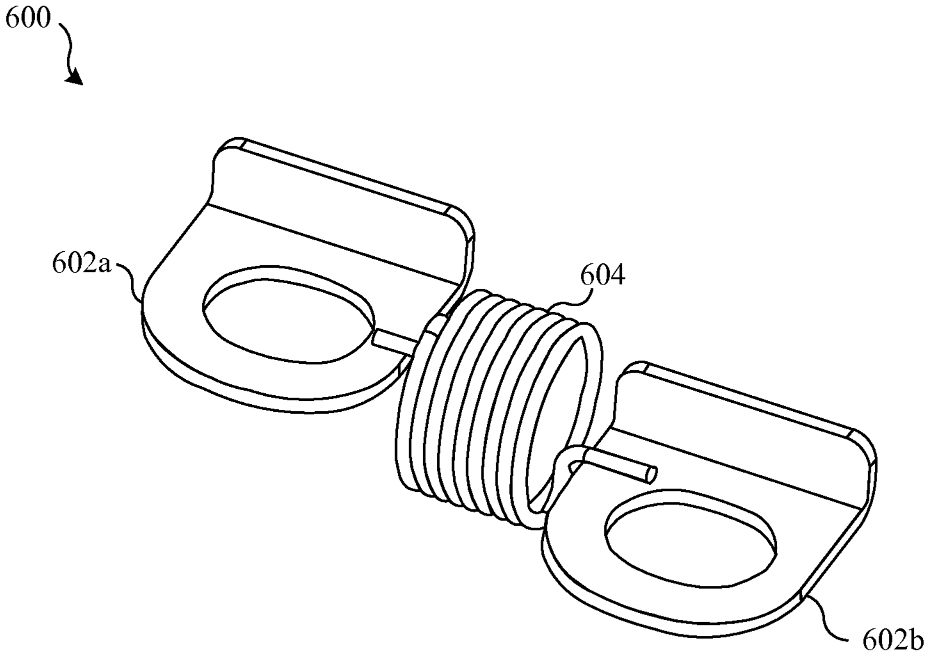
FIG. 6 depicts an alternative spring bracket connector having designated inductance characteristics, in accordance with various embodiments of the disclosure.
Figure 7:
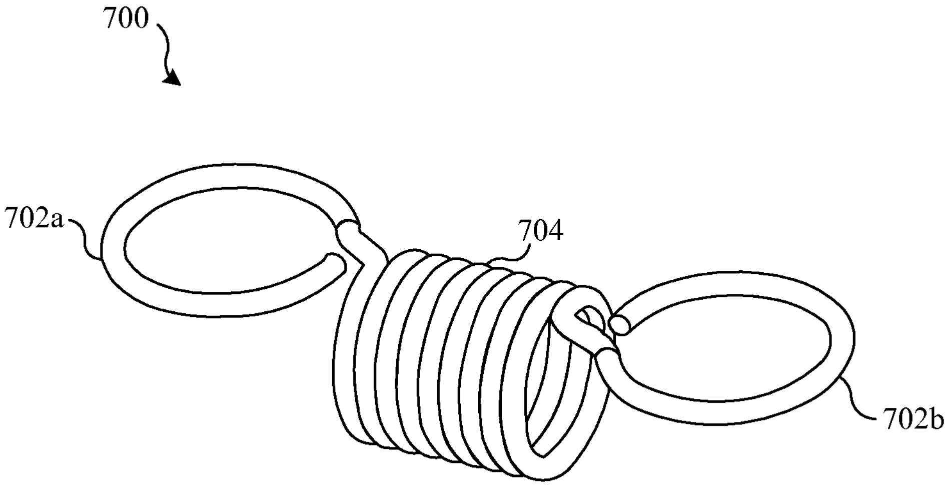
FIG. 7 illustrates an alternative spring wire connector having designated inductance characteristics, in accordance with some embodiments of the disclosure.

Accordingly, in various embodiments, the MLB of mobile device 102 can be connected to antenna element 110 using one or more flexible, shock-absorbing connectors (e.g., one of flexible connectors 104, 106, and 108), optionally having a built-in inductance. In some implementations, a flexible shock-absorbing connector can be shaped like a coil with a bracket or a wire loop at each end to allow for fastening to an MLB. By way of example, FIG. 6 depicts an alternative spring connector 600 having brackets 602*a* and 602*b* at each end of an inductive wire coil conductor 604, in accordance with various embodiments of the disclosure. FIG. 7 depicts another alternative spring connector 700 having wire loops 702*a* and 702*b* at each end of an inductive wire coil conductor 704, in accordance with various embodiments of the disclosure.

In various embodiments, the spring connector, 600 or 700, can be constructed of insulated or non-insulated wire with termini (ends) that are stripped to expose conductive metallic areas for signal connection, or soldered, welded, wrapped around 702*a*, 702*b*, or otherwise attached to separate connection pieces such as brackets 602*a* or 602*b*. The length of wire between the termini (ends) may be spring-coiled to provide installation flexibility, tolerance acceptance, shock-absorption, and desirable inductance. Inductance can be generated by the coiled nature of inductive wire coil conductor 604 or 704, located at the center area of the spring connector, 600 or 700. By tuning the thickness (gauge) of the wire, the insulation thickness and dielectric value, the shape of the loops, the coil diameter or size, and the number of loops, the inductance of spring connector 600 or 700 may be fine-tuned to a desired value. For example, the formula for inductance for spring connector 600 or 700 is provided as follows:

$$L_{coil} = \frac{N^2 \times \mu \times A_{coil}}{l_{coil}}, \quad \text{(Eq. 1)}$$

where

L=Inductance;

N=the number of turns in the spring coil;

μ=the permeability of the spring coil material;

A=the circular area of the spring coil ($m^2$); and l=the length of the spring coil (m).

In accordance with various embodiments, the use of spring connectors 600 or 700, such as those depicted in FIGS. 6 and 7 can eliminate the need for including separate or discrete inductors or various alternative means for providing inductance (e.g., the embedded trace inductor depicted in FIG. 2). In various implementations, and as defined in Eq. 1, the thickness (gauge) of the wire, the wire material, the insulation stiffness, the number of loops in a spring connector, the diameter or area of the loops, and/or the overall length of the spring connector, may be carefully selected to provide sufficient inductance and mechanical connector strength to enable the spring connector to hold its shape, while at the same time providing sufficient compliance for flexibility and shock-absorption. Further, it should be understood that incorporating inductive properties directly into a connector greatly improves ease of assembly, part tolerance/forgiveness, and reliability during drop events, including high vibration.

Figure 8:
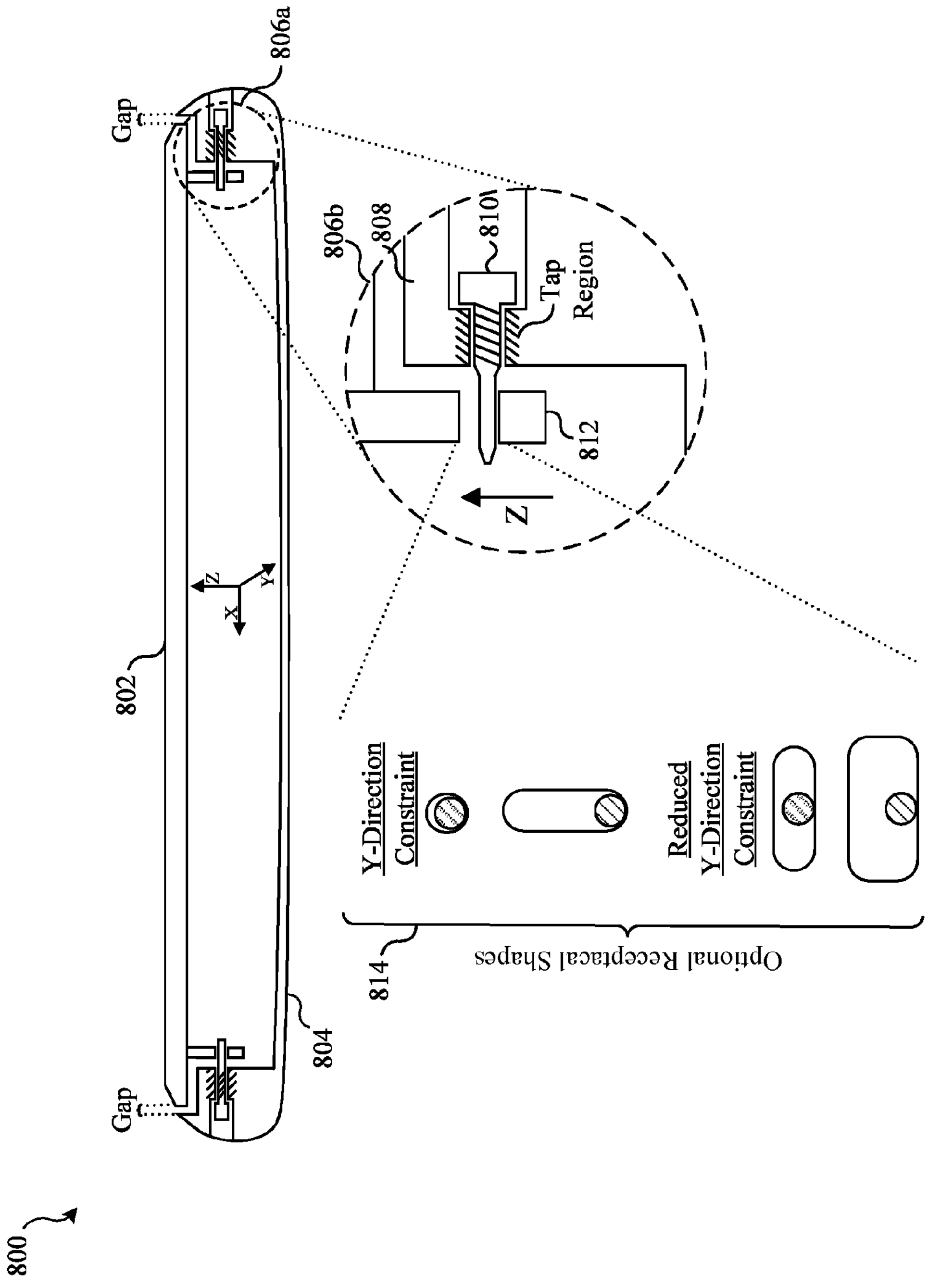
FIG. 8 depicts a cross-sectional diagram of a mobile device showing a resilient connector assembly for a display of the mobile device, in accordance with various embodiments of the disclosure.

FIG. 8 depicts a cross-sectional diagram of mobile device 800 showing resilient connector assembly 806*a* for display portion 802 of mobile device 800, in accordance with various embodiments of the disclosure. In some configurations, mobile device 800 may include display portion 802, e.g., a liquid crystal display (LCD) and a corresponding mounting structure, and lower housing portion 804 that can be attached to display portion 802 of mobile device 800 with multiple pin-screw connectors 810. For ease of understanding, the configuration of the cross-sectional diagram is described with respect to the X, Y, and Z directions (with reference to a 3-dimensional graph having X, Y, and Z axes).

An exploded view of resilient connector assembly 806*a* is provided to show a more detailed view of connector assembly components 806*b*, as well as, the manner in which components 806*b* connect with each other. In some embodiments, lower housing portion 804 of mobile device 800 can include multiple, tapped screw hole vias 808 within which, an individual pin-screw connector 810 can connect through (via a screw thread) to allow the pin portion of pin-screw connector 810 to slide through and engage single flange receptacle 812 of display portion 802. In this arrangement, pin-screw connector 810 may have screw thread only on an upper portion thereof to connect with a corresponding threaded portion of the tapped screw hole via 808, thereby fixedly coupling pin-screw connector 810 to only tapped screw hole via 808 of lower housing portion 804 of mobile device 800 along each of the X, Y, and Z directions.

In this arrangement, pin-screw connector 810 that is fixedly coupled to tapped screw hole via 808 of lower housing portion 804 can slide through flange receptacle 812 of display portion 802 to engage/retain flange receptacle 812 in only the Z-direction. For example, slotted receptacle 814 may take the form of various optional receptacle shapes (e.g., various slotted receptacle shapes) are depicted having a reduced Y-direction constraint. A fitted, circular receptacle shape can constrain pin-screw connector 810 at the flange receptacle in each of the Y and Z directions. In contrast, the various slotted receptacle shapes can have reduced constraint of pin-screw connector 810 in the Y-direction, in accordance with the particular shape of the receptacle. However, each of these slotted receptacle shapes are designed to engage pin-screw connector 810 in the Z-direction so that display portion 802 is securely held in contact with the lower housing portion of mobile device 800.

In various scenarios, during a drop event, the gap spacing at the periphery of display portion 802 can become misaligned if lower housing portion 804 were fixedly coupled to the display portion 802 in the X, Y, and Z directions. Accordingly, by configuring pin-screw connector 810 to only purposely engage display portion 802 (e.g., at flange receptacle 812) of mobile device 800 in the Z-direction, during a drop event, the display portion can shift a designated distance in both the X-direction and the Y-direction (e.g., by employing slotted receptacle 814 shape in the flange receptacle), when configured accordingly.

In accordance with various embodiments, FIGS. 9A-9E depict hardware-level diagrams of another flexible connector 900. Flexible connector 900 may be utilized in mobile device 102 to connect main logic board (MLB) 902 to an antenna element within the main housing of mobile device 102. In some embodiments, flexible connector 900 may take the place of previously discussed flexible connector 104. Flexible connector 900 functions to maintain the connection between the antenna element and MLB 902 during a drop event, or some other impact event by including a bend region that accommodates relative motion between the antenna element and MLB 902.

Figure 9A:
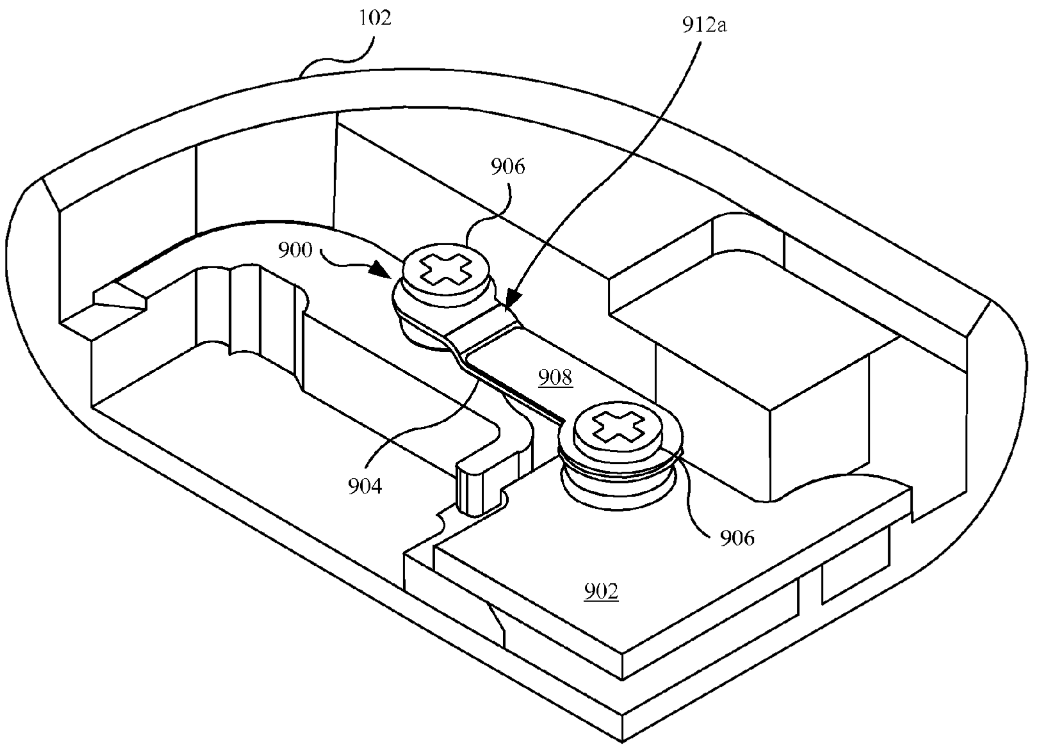
FIGS. 9A-9E depict hardware-level diagrams showing an flexible connector that includes a bend region for accommodating relative motion of internal components connected by the flexible connector.

As depicted in FIG. 9A, flexible connector 900 can connect MLB 902 to the antenna element via flexible circuit 904. Flexible circuit 904 includes openings through which fasteners 906 can pass to mechanically and electrically secure flexible circuit 904 to MLB 902 and the antenna element. Flexible circuit 904 can include a copper trace layer for conductively passing RF signals from the antenna element to MLB 902. For example, MLB 902 and the antenna element can both include electrically conductive pathways for routing the RF signals to and from flexible circuit 904. In some embodiments, the electrically conductive pathways of MLB 902 can be configured to route the RF signals to antenna related circuitry and/or processing components. In some embodiments, MLB 902 can include electrically conductive pathways for passing the RF signals to chassis ground. Flexible circuit 904 can be coupled to the antenna element and MLB 902 by way of fasteners 906 and include stiffener 908. Flexible circuit 904 also includes a bend region 912*a* that extends beyond stiffener 908. Bend region 912*a* provides a number of advantages to flexible connector 900. Bend region 912*a* accommodates an elevation difference between fasteners 906 of flexible circuit 904 in relation to MLB 902, thereby allowing flexible circuit 904 to be coupled with fasteners 906. Furthermore, because bend region 912*a* is formed of flexible material, bend region 912*a* can deform when fasteners 906 are moved closer together and straighten when fasteners 906 are moved farther apart. Stiffener 908 also provides a number of benefits, including providing support for flexible circuit 904, preventing wear on flexible circuit 904, and electrically isolating flexible circuit 904 from various other hardware components of mobile device 102. Furthermore, stiffener 908 can reduce a likelihood of flexible circuit 904 contacting other nearby hardware components during a drop event. Stiffener 908 can also function to limit bending of flexible circuit 904 to bend region 912*a* by reinforcing a portion of flexible circuit 904 to which stiffener 908 is attached. For example, flexible circuit

904 may include another component that would cause flexible circuit 904 to deform if not for the reinforcement provided by stiffener 908.

Figure 9B:
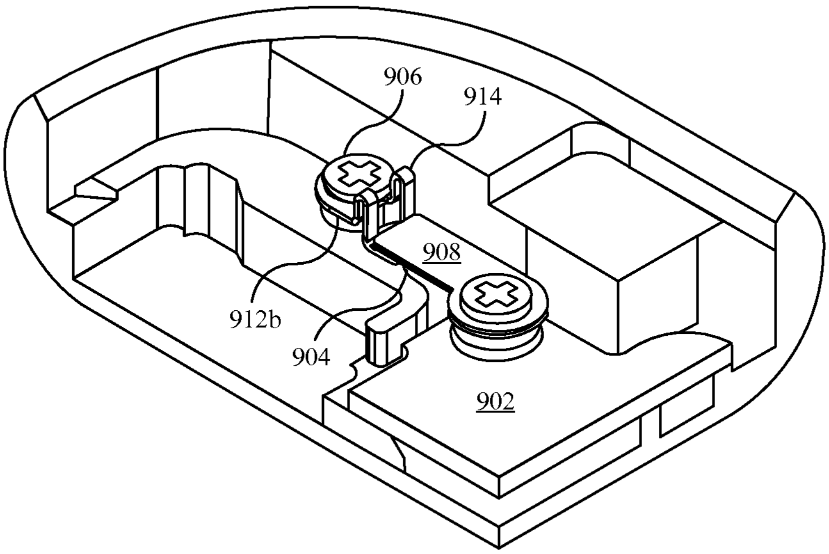

FIG. 9B depicts an embodiment of flexible connector 900 in which the bend region is created by spring clip connector 912*b*. One end of spring clip connector 912*b* can be coupled (e.g., soldered) to a surface of flexible circuit 904. In some embodiments, spring clip connector 912*b* can include a flattened region that is soldered to at least one electrically conductive pathway disposed upon the surface of flexible circuit 904. In some embodiments, spring clip connector 912*b* can be a metal (e.g., a stainless steel, copper, or aluminum, etc.) or a non-metal conductive, mechanical spring structure that flexibly couples flexible circuit 904 to fasteners 906 and the antenna element. Spring clip connector has a humpback geometry that forms a number of bends that can bend and/or flex when force is applied. The bends also help to change an elevation of the spring clip connector so that the opposing ends of spring clip connector 912*b* are correctly positioned to contact both flexible circuit 904 and fastener 906. Spring clip connector 912*b* can also include a cutout that forms a number of arms 914. A thickness and width of arms 914 can be optimized to establish a flexibility of the bend region formed by spring clip connector 912*b*. Because arms 914 form a smaller area than without a cutout, the solder area between spring clip connector 912*b* and flexible circuit 904 can be reduced.

Figure 9C:
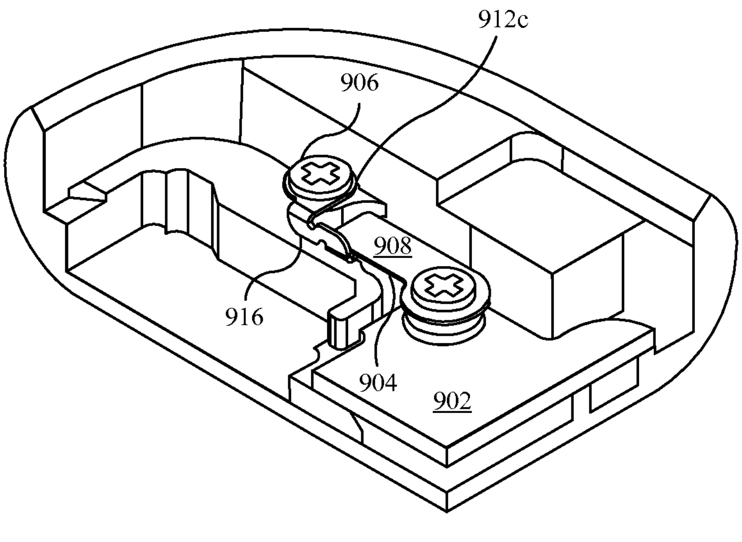

FIG. 9C depicts an embodiment in which spring clip connector 912*c* forms the bend region. Spring clip connector 912*c* includes portion 916 offset to one side of flexible circuit 904. Portion 916 can then form a number of bends in order to form a contact patch that can be electrically coupled with flexible circuit 904. By offsetting portion 916 of spring clip connector 912*c* to one side, the bend region can be shifted perpendicularly with respect to stiffener 908. This offset configuration of spring clip connector 912*c* can allow for a longer stiffener and for a length of spring clip connector 912*c* between fastener 906 and stiffener 908 to be increased. During drop events, the increased length of spring clip connector 912*c* can allow for additional force caused by a drop event to be dissipated.

Figure 9D:
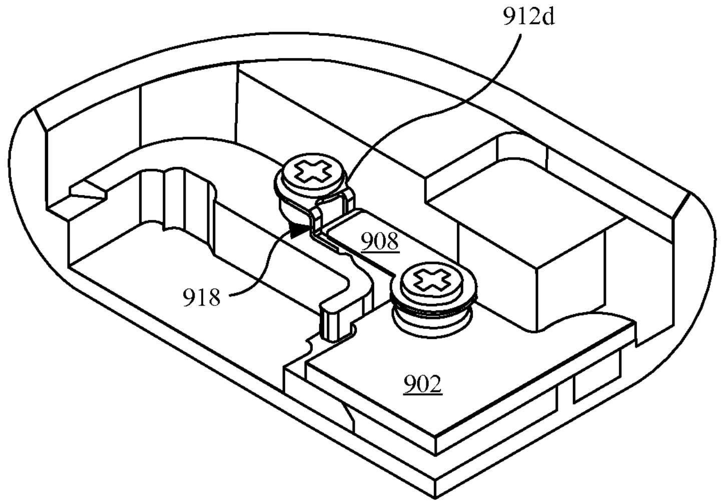

FIG. 9D depicts an embodiment of flexible connector 900 in which spring clip connector 912*d* forms the bend region. Spring clip connector 912*d* includes a stepped clip. The stepped clip connector can minimize the risk of electrically shorting the connection. In some embodiments, spring clip connector 912*d* can provide electrical contact with the other electrical component followed by one or more bends, which allow the spring clip connector 912*d* to provide electrical contact to MLB 902. Spring clip connector 912*d* can include a cutout forming a number of arms 918. A thickness and width of arms 918 can be optimized in order to adjust the flexibility of the bend region. Additionally arms 918 have less surface area than without the cutout, thereby reducing the solder required when coupling the spring clip connector to the flex. In some embodiments, the stepped clip can be the shortest path between MLB 902 and the antenna element. By shortening the path between the components, the electrical resistance can be reduced, thereby increasing efficiency of flexible connector 900.

Figure 9E:
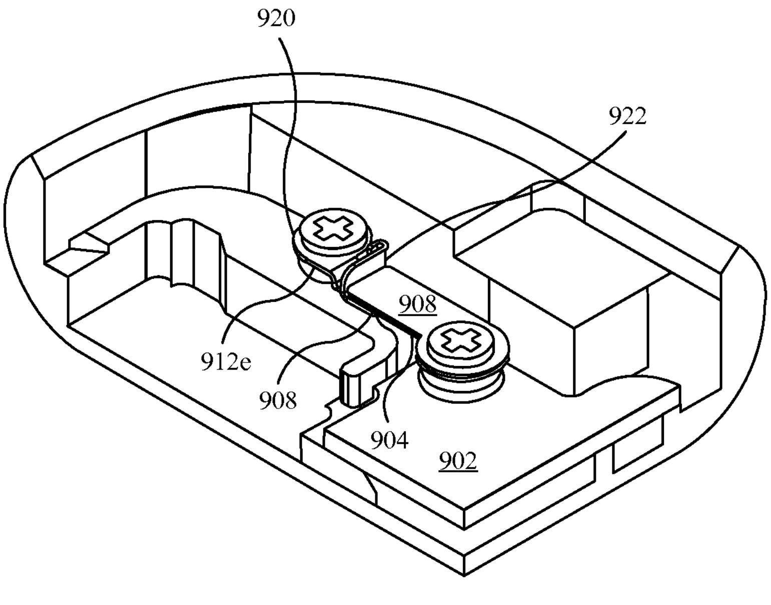

FIG. 9E depicts an embodiment of flexible connector 900 in which spring clip connector 912*e* forms the bend region. In this embodiment, spring clip connector 912*e* is formed of two separate components: screw knuckle 920 and metal hem 922, which are mechanically pressed together to form an electrically conductive pathway. Screw knuckle 920 can be formed of a flat sheet of metal that includes an opening through which fastener 906 can couple screw knuckle 920 to the antenna element. Screw knuckle 920 can also include a protrusion that is bent and forms a contact patch that faces towards MLB 902. Metal hem 922 can also be formed for a sheet of metal that has a first end that is coupled to flexible circuit 904 and a second end that exerts a force against the contact patch of screw knuckle 920. The second end of metal hem 922 exerts a biasing spring force against the contact patch by virtue of a number of bends in metal hem 922. In some embodiments, contact between the metal hem and the screw knuckle can be maintained solely by friction and spring tension. Although a drop event may cause the screw knuckle and metal hem to momentarily lose electrical and/or physical contact, the contact may be self-healed due to the internal spring biasing. Furthermore, in some embodiments, screw knuckle 920 and metal hem 922 can slide against one another without breaking electrical and/or physical contact during a drop event.

It should be understood that the spring clip connector may be coupled to MLB 902 using any other common coupling implement, without departing from the spirit and scope of the disclosure. For example, bend region 912*a* and stiffener 908 can form a single piece. In some embodiments, the spring clip connector or the flat connector can be a metal (e.g., a stainless steel, copper, or aluminum, etc.) or a non-metal conductive, mechanical spring structure.

In some configurations, the spring clip connector can have one or more bends in the X, Y, and Z directions (with reference to a 3-dimensional graph having X, Y, and Z axes), which, in combination with the flat connector, allow the flexible circuit to bend and flexibly deform during a drop event, without mobile device 102 sustaining any permanent damage at the flexible connector 900. This functionality can be considered to be a self-healing mechanism for the internal hardware components of the flexible connector 900. In some embodiments, the flexible circuit may comprise an inductor element that is necessary for antenna function and operation (e.g., for RF impedance matching), as would be readily understood by those in the field of antenna engineering. In various configurations, the flex's inductor may be embedded within the flat connector or the spring clip connector as a copper trace (during fabrication). Alternatively, the inductor may be embodied as a discrete circuit component that is coupled to (e.g., soldered to) the flexible circuit as an add-on circuit element.

The foregoing description, for purposes of explanation, used specific nomenclature to provide a comprehensive understanding of the described embodiments. However, it should be apparent to one skilled in the art that all of the specific details are not required in order to practice the described embodiments. Thus, the foregoing descriptions of specific embodiments are presented for purposes of illustration and description. They are not intended to be exhaustive, or to limit the described embodiments to the precise forms disclosed. It will be apparent to one of ordinary skill in the art that many modifications and variations are possible in view of the above teachings.

What is claimed is:

1. A flexible connector, comprising:

a first spring clip connector configured to be electrically coupled with a first electrical component by way of a first fastener;

a flexible circuit, comprising:

a first end coupled to the first spring clip connector, and a second end configured to be secured to a second electrical component by way of a second fastener; and a stiffener substantially overlaying a portion of the flexible circuit, the stiffener providing rigidity to the flexible circuit, wherein the first spring clip connector accommodates relative changes in position between the first electrical component and the second electrical component when the flexible connector is coupled with the first electrical component and the second electrical component.

2. The flexible connector of claim 1, further comprising:

a second spring clip connector configured to be electrically coupled with the second electrical component by way of the second fastener, wherein when the second spring clip connector is directly coupled to the second end of the flexible circuit, the second spring clip connector cooperates with the first spring clip connector to accommodate relative changes in position between the first electrical component and the second electrical component during the relative changes in position.

3. The flexible connector of claim 1, wherein the flexible circuit further comprises an electrical structure configured to provide an in-line inductance between the first electrical component and the second electrical component, the in-line inductance matching an impedance between the first electrical component and the second electrical component.

4. The flexible connector of claim 1, wherein the stiffener is coupled to the second end of the flexible circuit by way of the second fastener.

5. The flexible connector of claim 1, wherein the first electrical component comprises an antenna element and the second electrical component comprises a printed circuit board (PCB) or a main logic board.

6. A mobile device, comprising:

an antenna element; and a printed circuit board (PCB) coupled to the antenna element by way of a flexible connector, the flexible connector comprising:

a spring clip connector coupled to the antenna element, a flexible circuit coupled to the spring clip connector at a first end and the PCB at a second end, and a stiffener coupled to the flexible circuit that resists movement of the flexible circuit during changes in position of the antenna element with respect to the PCB so that substantially all force imparted to the flexible connector by the changes in position is accommodated by the spring clip connector.

7. The mobile device of claim 6, wherein the stiffener is configured to prevents substantial deformation of the flexible circuit during changes in position that are caused by a drop event.

8. The mobile device of claim 7, wherein the spring clip connector comprises an electrically insulating coating that electrically isolates a portion of the spring clip connector thereby preventing the portion of the spring clip connector from creating a short circuit.

9. The mobile device of claim 6, wherein the antenna element comprises a substantially flat portion disposed on a first plane and the PCB comprises a substantially flat portion disposed on a second plane, the first plane and the second plane being parallel to each other and non-intersecting.

10. The mobile device of claim 6, wherein the spring clip connector comprises one or more bends, the one or more bends having geometry selected to provide compliance in one or more directions.

11. The mobile device of claim 6, wherein the spring clip connector further comprises:

a flat portion substantially parallel to the antenna element forming an opening for a fastener securing the spring clip connector to the antenna element;

a surface soldered to the flexible circuit, and a plurality of arms formed from one or more bends that connect the flat portion to the surface wherein a thickness of the plurality of arms provides compliance that absorbs a portion of the force imparted to the plurality of arms.

12. The mobile device of claim 11, wherein the plurality of arms form a bend increasing compliance of the spring clip connector.

13. The mobile device of claim 6, wherein the spring clip connector further comprises:

a first end comprising a flat portion substantially parallel to the antenna element, the flat portion defining an opening for a fastener securing the spring clip connector to the antenna element;

a second end, comprising a surface soldered to the flexible circuit; and a single arm joining the first end to the second end, the single arm comprising a plurality of bends that allow the spring clip connector to absorb force imparted during an impact event in a plurality of directions.

14. The mobile device of claim 6, wherein the spring clip connector further comprises a first flat portion defining an opening for a fastener to secure the spring clip connector to the antenna element and a bend forming a first contact patch biased to physically contact a second contact patch, the second contact patch formed from a bend forming a second flat portion soldered to the flexible circuit.

15. The mobile device of claim 14, wherein the second contact patch is biased to physically contact the first contact patch.

16. A mobile device comprising:

an antenna element; and a printed circuit board (PCB) electrically coupled to the antenna element by way of an inductive flexible connector, the inductive flexible connector comprising:

a spring clip connector secured to the antenna element, a flexible circuit coupled to the spring clip connector, the flexible circuit comprising a trace providing an in-line inductance between the antenna element and the PCB, and a stiffener for constraining movement of the flexible circuit, wherein the spring clip connector deforms to accommodate relative movement of the antenna element with respect to the PCB.

17. The mobile device of claim 16, wherein the in-line inductance is further selected to match an impedance between the antenna element and the PCB.

18. The mobile device of claim 16, further comprising an inductor surface mounted to the flexible circuit and in electrical communication with the trace.

19. The mobile device of claim 16, wherein the relative movement is caused by a drop event and the spring clip connector is configured to dissipate force transferred to the inductive flexible connector.

20. The mobile device of claim 16, wherein the trace comprises a copper trace.

* * * * *